United States Patent [19]

Anthony et al.

[11] 4,157,564
[45] Jun. 5, 1979

[54] DEEP DIODE DEVICES

[75] Inventors: Thomas R. Anthony; Harvey E. Cline, both of Schenectady, N.Y.

[73] Assignee: General Electric Company, Schenectady, N.Y.

[21] Appl. No.: 846,576

[22] Filed: Oct. 28, 1977

Related U.S. Application Data

[62] Division of Ser. No. 743,273, Nov. 19, 1976, Pat. No. 4,091,257.

[51] Int. Cl.² .............................................. H01L 29/04
[52] U.S. Cl. ........................................ 357/60; 357/45; 357/55; 357/88; 357/89; 357/90
[58] Field of Search ...................... 357/60, 45, 55, 88, 357/89, 90

[56] References Cited

U.S. PATENT DOCUMENTS 2,813,048  11/1957  Pfann .................................. 357/60

Primary Examiner—Edward J. Wojciechowicz
Attorney, Agent, or Firm—Charles T. Watts; Joseph T. Cohen

[57] ABSTRACT

Deep diodes which extend in straight lines through a silicon wafer are produced by migrating aluminum droplets through the wafer while maintaining a finite temperature gradient through the wafer in the direction of straight line droplet travel, and at the same time maintaining a zero temperature gradient through the wafer in a direction normal to the droplet travel course. Unidirectional heat flow apparatus implementing this method is also disclosed.

6 Claims, 8 Drawing Figures

DEEP DIODE DEVICES

This is a division, of application Ser. No. 743,273, filed Nov. 19, 1976, now U.S. Pat. No. 4,091,257.

The present invention is related generally to the art of temperature gradient zone melting and is concerned more particularly with unique deep diode devices in which the P-N junctions extend in straight lines deeply into or through the semiconductor body, and is also concerned with a new method of producing these devices and with novel apparatus implementing this method.

CROSS REFERENCES

This invention is related to those of the following patents assigned to the assignee hereof:

U.S. Pat. No. 3,901,736, issued Aug. 26, 1975, entitled "Method of Making Deep Diode Devices" in the names of Thomas R. Anthony and Harvey E. Cline, which discloses and claims the concept of embedding or depositing the solid source of the migrating species within the matrix body instead of on that body to overcome the tendency for migration to be irregular and to lead to non-uniformity in location and spacing of the desired P-N junctions.

U.S. Pat. No. 3,898,106, issued Aug. 5, 1975, entitled "High Velocity Thermomigration Method of Making Deep Diodes" in the names of Harvey E. Cline and Thomas R. Anthony, which discloses and claims the concept of carrying out thermal gradient zone melting at relatively high temperatures including temperatures approaching the melting point temperature of the material of the matrix body.

U.S. Pat. No. 3,910,801, issued Oct. 7, 1975, entitled "High Velocity Thermomigration Method of Making Deep Diodes" in the names of Harvey E. Cline and Thomas R. Anthony, which discloses and claims the concept of using the high velocity thermomigration method to produce migration trails of recrystallized material running lengthwise of an elongated matrix body and then dividing the matrix into a number of similar deep diodes by cutting the matrix body transversely at locations along the length of the migration trails.

U.S. Pat. No. 3,902,925, issued Sept. 2, 1975, entitled "Deep Diode Device and Method" in the names of Thomas R. Anthony and Harvey E. Cline, which discloses and claims the concept of minimizing the random walk of a migrating droplet in a thermal gradient zone melting operation by maintaining a thermal gradient a few degrees off the [100] axial direction of the crystal matrix body and thereby overwhelming the detrimental dislocation intersection effect.

U.S. Pat. No. 3,899,361, issued Aug. 12, 1975, entitled "Stabilized Droplet Method of Making Deep Diodes Having Uniform Electrical Properties" in the names of Harvey E. Cline and Thomas R. Anthony, which discloses and claims the concept of controlling the cross-sectional size of a migrating droplet on the basis of the discovery that one millimeter is the critical thickness dimension for droplet physical stability.

BACKGROUND OF THE INVENTION

It has been generally recognized that semi-conductor diode devices which have substantial depth beyond that readily achievable in the planar geometry presently in general use would offer important advantages to the user. Thus, shallow diode arrays produced on the surface of thin wafer silicon by diffusion or expitaxial techniques and used for imaging are not capable of use in the X-ray and infrared radiation regions because of the low absorption constant of silicon for such radiation. While a thick target could compensate for this shortcoming of silicon, resolution in the shallow diode array geometry would be lost by diffusion and smearing out of electrons and holes parallel to the target surface before reaching the shallow surface diodes from generation points within the target bulk. But if use could be made of deep diode geometry, both high sensitivity (because of target thickness) and good resolution (because of the detecting diodes deep within the target bulk) might be achieved.

Efforts in the prior art to produce deep diode arrays have not been successful enough for general application. These efforts are best exemplified by the disclosure in U.S. Pat. No. 2,813,048, issued Nov. 12, 1957 to W. G. Pfann. Apparently, a principal difficulty encountered by Pfann and those following Pfann's teachings is the fact that the straight-line deep diodes shown in this patent were not obtainable in actual practice. Instead, Pfann's P-N junctions were curved as droplets followed by a banding course in migration through the semiconductor wafer bodies. Even in relatively thin sections used by Pfann and others at that time, the curving course of droplet migration was apparent, and it is not possible to compensate for this departure from the idealized form of deep diode illustrated and described in the Pfann patent.

SUMMARY OF THE INVENTION

The key concept underlying this invention is to establish and maintain heat flow unidirectionally from a hot side to a cold side of a semiconductor wafer or, in other words, to maintain a steep temperature gradient in one direction through the body while maintaining a zero temperature gradient in a direction perpendicular to the first direction.

This concept is based upon our discovery that the curvature of a typical droplet migration path during temperature gradient zone melting results from the droplet following a heat flow line which in turn is governed as to location and shape by the flow of heat lateral to the direction of the intended droplet travel path. Thus, by delivering heat to the top of a semiconductor wafer and withdrawing heat from the underside thereof while maintaining zero heat transfer at the sides of the wafer, straight line (i.e., vertical) droplet travel from the cold side to the hot side can be maintained.

We have also discovered that when a workpiece wafer or chip very much thinner than those known and used in the prior art, such as about 10 mils thickness, the tendency for heat flow laterally and heat loss from the periphery of the wafer is negligible. In other words, the thickness to volume or mass ratio is such that a zero thermal gradient normal to the wafer major axis, i.e., parallel to the planar top and bottom surfaces of the wafer, is established and maintained throughout the heating and droplet migration period.

We have further discovered that it is not critical to the desired results of this invention that the wafer have any particular geometrical form, that the wafer be silicon or other particular semiconductive matrix material, or that the migrating species be aluminum or other particular doping substance. We have also determined that the source of the heat is important to these results only in that the mode of heat delivery to the wafer is consistent with the establishment and maintenance of unidirectional heat flow through the wafer body. Electric resistance heating means as subsequently described in detail may be used instead of our presently preferred electron beam heating mode. The special design considerations and features important to the desired result are further described in detail in reference to the drawings herein.

DESCRIPTION OF THE DRAWINGS

Novel features of the invention are illustrated in the drawings accompanying and forming a part of this specification, in which.

DETAILED DESCRIPTION OF THE INVENTION

Figure 1:
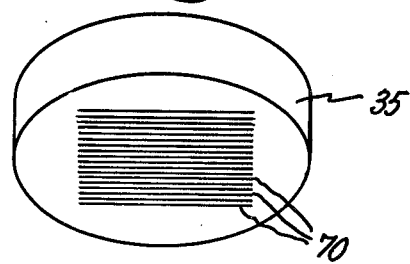
FIG. 1 is a view in perspective of a silicon wafer containing small aluminum deposits within the wafer surface just prior to initiation of droplet migration.

In brief, the method of this invention embodying the key concept and other novel features stated above comprises the steps of providing within a matrix body of a semiconductor material, a plurality of separate spaced deposits of a fusible second material with which the semiconductor material will form a solution of melting point temperature below that of the semiconductor material, heating the second material and thereby forming a liquid solution of the semiconductor material, and migrating the resulting liquid solution bodies in straight-line paths through the matrix body. Straight-line travel of the bodies through the matrix is accomplished by establishing and maintaining a finite thermal gradient in a first direction through the matrix body and coextensively in time establishing and maintaining a zero temperature gradient in the matrix body in a direction normal to the first direction.

The semiconductor material may be silicon, germanium, silicon carbide, a compound of a Group II element and a Group IV element, or a compound of a Group III element and a Group V element, such as gallium arsenide or aluminum phosphide.

In the preferred practice of this novel method, silicon and aluminum are used and droplet migration is from the lower surface of a silicon wafer to the top of it, both surfaces being substantially planar and the heating source being located directly above the wafer and a heat sink being located directly below it. If desired, suitable dopant material may be added to the aluminum or silicon, or both, to provide particular semiconductive characteristics in the resulting P-N junctions.

These devices may be made in a variety of configurations, it being possible, for example, to alter the course of straight-line droplet migration during droplet travel through the matrix by changing the relative positions of the heat source and heat sink means. Still further, it will be understood that the term "droplets" means and includes small, individual drops alone or disposed as ordered arrays in the matrix as well as lines, i.e., elongated droplets which on migration produce planar trails of recrystallized material instead of the line or column-like trail of recrystallized material typical of the migrated small droplet.

In general, the new products of this novel method comprise in each instance a matrix body of N- or P-type semiconductive material, and a plurality of separate P- or N-type recrystallized regions or droplet trails which extend along straight lines through the body from one surface to another and provide a plurality of continuous P-N junctions in ordered array duplicated at two surfaces of the body. These are step junctions and they are free from extraneous impurities because they are within the matrix body at the interface between the material of the matrix and each of the recrystallized regions.

More specifically, the recrystallized regions may be column-like or substantially planar and they may be from one to twenty mils in cross section as columns, or as planes. Spacing between column-like recrystallized regions is suitably about five mils while that of the planar geometry may be as close as two mils. By the present method, such spacings are uniformly maintained over trail lengths hundreds of times greater than the spacing dimensions.

The apparatus of this invention includes a refractory metal shell which provides a chamber, heat sink means in the chamber, a heat source which is spaced above the heat sink, and a combination workpiece support and heat shield means positioned between the heat sink means and the heat source. The support means, which constitutes a key element of the combination of this novel apparatus, includes a refractory metal body which has an opening in which to receive a workpiece so that the upper and lower sides of the workpiece are exposed to the heat source and the heat sink means, respectively. When the workpiece is in position, it is enclosed around its periphery by the opening-defining wall with the result that the mass of the refractory body disposed laterally of the workpiece is effective in preventing heat flow to or from the sides of the workpiece. Again, in preferred practice, we provide spacing means to maintain the refractory body out of contact with both the heat source and the heat sink means. Additionally, the spacing is adjusted so that the gap between the heat source means and the workpiece is much smaller in dimension than the diameter of the heat source body, suitably in the ratio of at least 20 to 1. Thus, with the parts disposed coaxially, the heat source body extends beyond the periphery of the workpiece support body and considerably beyond the workpiece positioned for droplet migration to insure uniform heat delivery to the workpiece. The heat sink means is similarly dimensioned relative to the heat source means, the workpiece and the workpiece support to the same end objective of unidirectional heat flow in the workpiece throughout the term of droplet migration.

Figure 6:
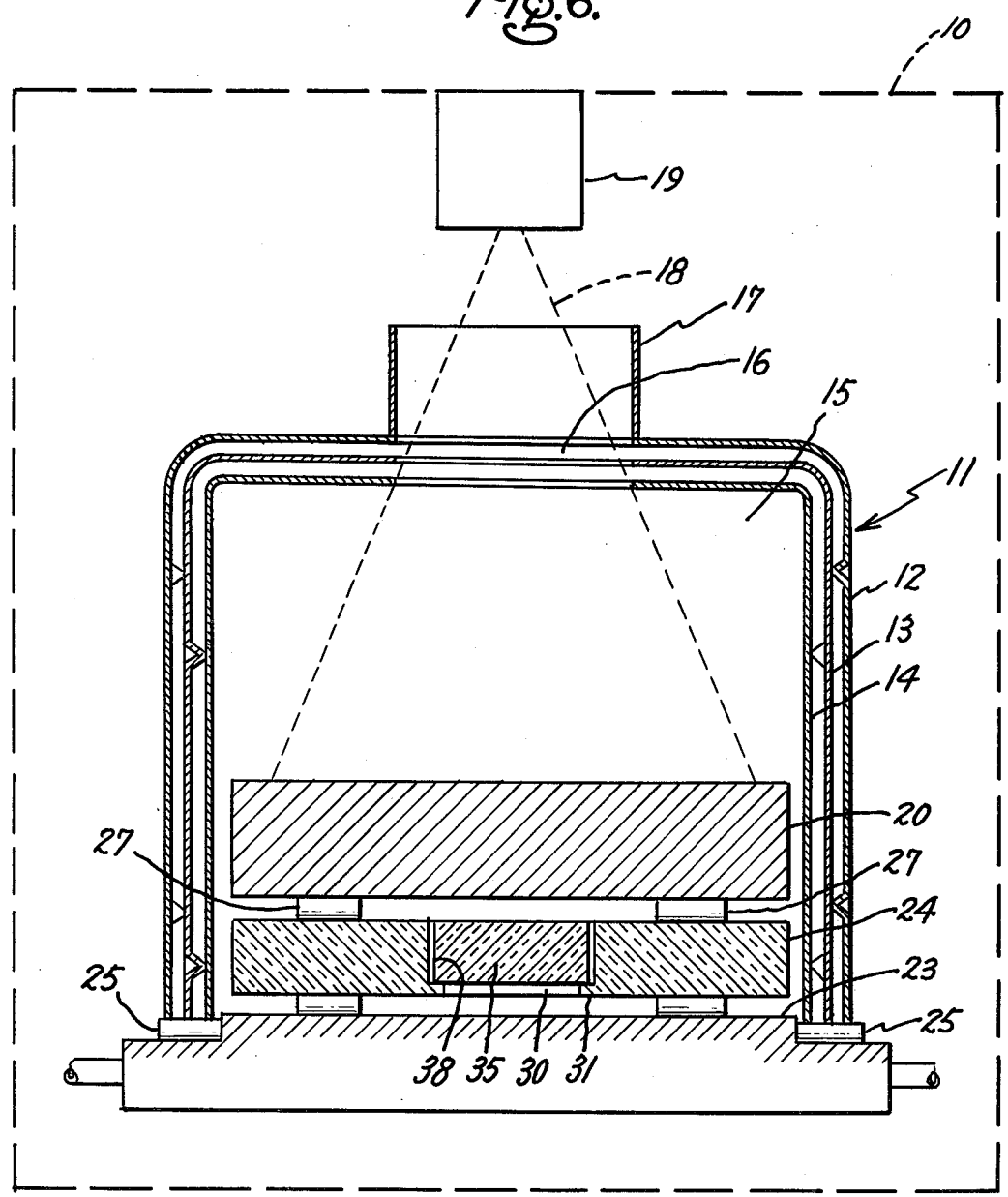
FIG. 6 is a vertical sectional view of apparatus of this invention in preferred form.

The apparatus of FIG. 6 is designed for use with an electron beam gun and incorporates within a suitable vacuum chamber 10 the features generally described above. A heat shield 11 comprising three nested, generally cup-shaped, closely-spaced tantalum shells 12, 13 and 14 disposed in inverted position provides a treating chamber 15. An electron beam-access opening 16 is provided in heat shield 11 and a hood 17 in a form of a tantalum flange is secured to shell 12 around opening 15 to prevent radiation from electron beam 18 generated by electron beam gun 19 from reaching shell 12, as the beam is directed at molybdenum block 20 in chamber 15 serving as the heat source.

Heat sink means 23 in the form of a water-cooled copper pedestal closes the lower portion of chamber 15 and serves as the support for heat shield 11, workpiece support body 24 and heat source block 20. Short, rod-like ceramic spacers 25 disposed at 90° intervals and resting on pedestal 23 insulate the lower edges of shells 12, 13 and 14 from the heat sink. Similar ceramic spacers 27 resting on pedestal 23 and on support body 24 maintain body 24 out of contact with both the heat source and the heat sink as body 24 and block 20 are supported in coaxial relation to gun 19.

Workpiece support body 24 is of silicon and provided with a central opening 30 of reduced diameter at the lower end, an annular step 31 being formed within the body to engage workpiece 35, which in this case is a silicon wafer. Workpiece 35 in the form of a disc rests within opening 30 on step 31, the upper flat surface of disc 35 being flush with the top surface of body 24 and disc diameter being less than the diameter of the upper portion of opening 30; so with workpiece 35 centered in body 24, there is a small annular gap between the workpiece and opposing annular wall 38 defining opening 30.

Figure 7:
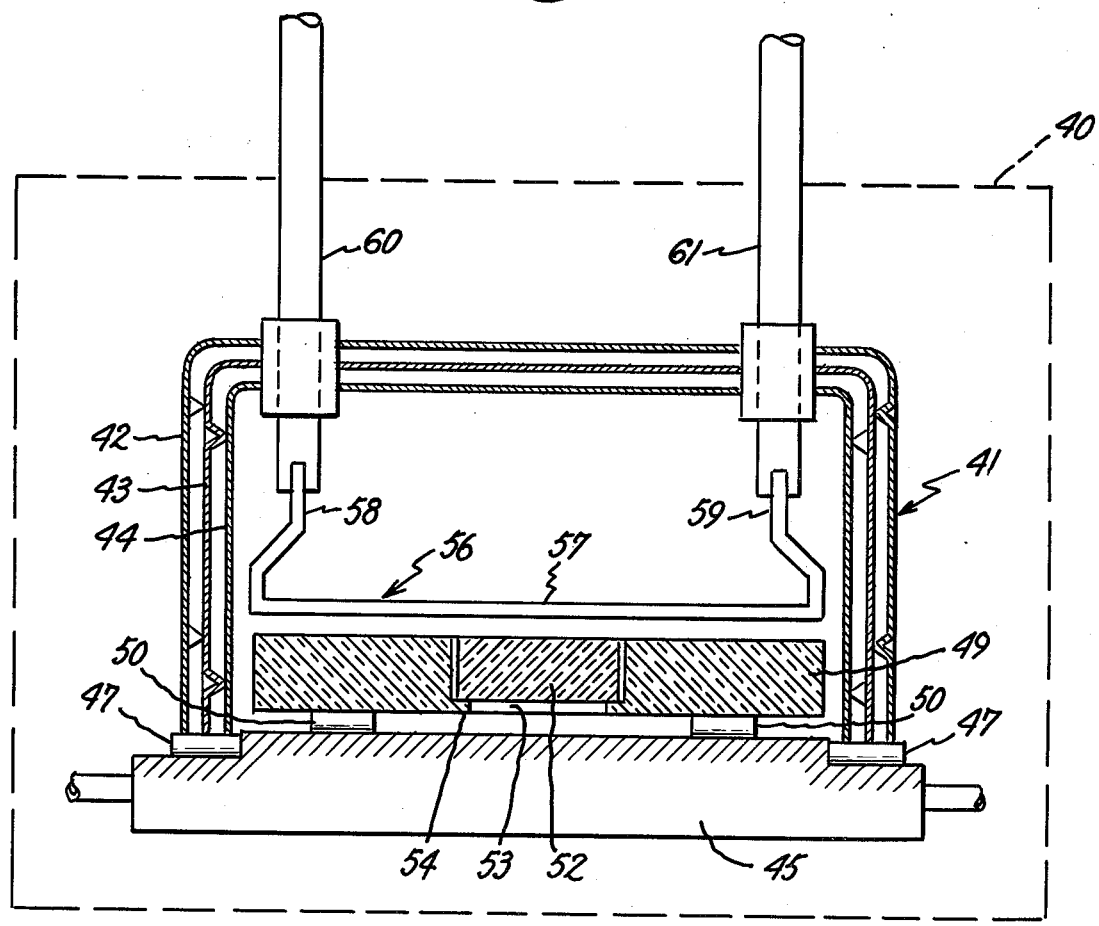
FIG. 7 is a view like that of FIG. 6 showing another form of the apparatus of the invention in which the heat source means is an electrical resistance heater assembly.

The apparatus illustrated in FIG. 7, like that of FIG. 6, is disposed within a suitable enclosure 40 and comprises a chamber-defining heat shield 41 in the form of a nested assembly of three closely-spaced, inverted, molybdenum cups 42, 43 and 44. A heat sink pedestal 45 supports shield 41, the lips of cups 42, 43 and 44 resting on small, red-like, ceramic spacers 47 on the pedestal. A silicon workpiece support body 49 is similarly supported on pedestal 45 by additional ceramic spacers 50. Workpiece 52, a square-cut silicon disc or wafer, is positioned in a central opening 53 in support body 49, resting on annular inner step 54 with top surface flush with the upper side of body 49 and with side surface separated by a small annular gap from the central opening-defining wall of the support body.

Heat source means 56, instead of being a comparatively massive block of refractory metal like that of body 20 of FIG. 6, is an electrical resistance heater element in the form of a tungsten sheet 57 having increased thickness flange portions shown at 58 and 59 for connection to leads 60 and 61 to an electrical power supply (not shown).

MODE OF OPERATION

In carrying out the invention described above using either the apparatus of FIG. 6 or that of FIG. 7, the workpiece prepared as described in our U.S. Pat. No. 3,901,736 is positioned in a workpiece support body assembled as shown in the drawings and described above. The heat sink water supply is turned on and the heat source body is then brought to temperature by means of electron beam heating (FIG. 6) or by electrical resistance heating (FIG. 7). The workpiece is thereby rapidly heated by radiation to the melting point temperature of the migrating species and higher to initiate and maintain the desired droplet migration. In each case, heat flow through the workpiece is parallel to the apparatus axis, i.e., vertical, as viewed in the drawings. Heat shields 11 and 41 prevent heat loss from workpiece support bodies 24 and 49, there being a thermal equilibrium established and maintained between the workpiece and the surrounding portion of its support body throughout the heating period so that there is substantially no heat flow between these components of the apparatus.

It is contemplated as an alternative to the illustrated embodiments that workpiece may be supported by heat-insulating means projecting from the inner wall of the support body at intervals around the periphery so as to avoid any metal-to-metal contact between the parts and thereby further diminish the possibility of heat flow between them.

Actual dimensions of the embodiment of the apparatus illustrated in FIG. 6, as well as other operating information and details, are set out in the following illustrative, but not limiting, examples of this invention as we have carried it out in actual practice:

EXAMPLE I

With reference to FIG. 6, an experiment was performed to test the present invention concepts stated above and defined in the appended claims. Workpiece 35 in the form of a disc or wafer of semiconductor-grade silicon was prepared as illustrated in FIG. 1 with a plurality of parallel line deposits 70 of aluminum, lines being 10 microns in cross section on 20-micron centers and established within the lower surface of the workpiece by the method disclosed and claimed in U.S. Pat. No. 3,901,736. Wafer 35 was one centimeter thick and five centimeters in diameter and was disposed in axial aperture 30 of silicon support body 24 (1.2 cm. thick and 7.0 cm. in diameter), the top surface of the wafer being flush with the top surface of body 24 and the wafer resting on annular step 31. Linear deposits 70 were exposed through the lower end of aperture 30 defined by step 31 and the side of wafer 35 was uniformly spaced about 0.2 mm. from the opposed wall defining the upper portion of central opening 30. Molybdenum heat source block 20 was 7.9 centimeters in diameter by two centimeters thick and ceramic spacers 27 were three millimeters in diameter and one centimeter long. Chamber 15 was ten centimeters high so that the clearance between block 20 and the ceiling of chamber 15 was five centimeters. With the assembly centered in chamber 15, support body 24 was about one centimeter from the opposing side wall portion of shield 11. The diameter of electron beam access opening 16 was four centimeters.

Figure 2:
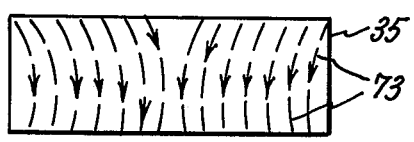
FIG. 2 is an enlarged, vertical sectional view of a silicon wafer like that of FIG. 1, illustrating the heat flow lines typical of the prior art practice described above.
Figure 4:
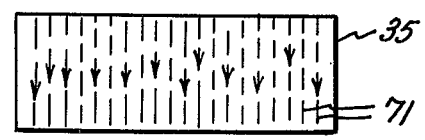
FIG. 4 is a view like that of FIG. 2, illustrating the heat flow lines in a silicon wafer in accordance with the present invention.

During operation, heat sink 23 was maintained at about room temperature (25° C.), the vacuum in chamber 10 was $2 \times 10^{-5}$ torr, and power was delivered to electron beam gun 19 at the level of 3.8 Kw (10 Kv). The temperature of block 20 was quickly raised to 1530° C. and maintained there while the temperatures of the top and bottom of wafer 35 were established and held at 1250° C. and 1200° C., respectively. The electron beam was maintained for four hours with the result that unidirectional heat flow through workpiece 35 was maintained throughout the period in the pattern indicated at 71 in FIG. 4. This contrasted with the situation illustrated in FIG. 2 where, according to prior art practice, heat flow was permitted to follow curving courses through the workpiece as indicated at 73.

Figure 3:
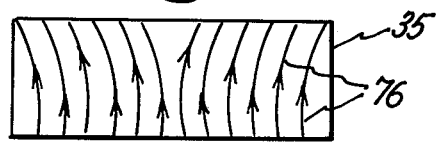
FIG. 3 is a view of the FIG. 2 wafer following droplet migration and thus representing a typical deep diode product of the prior art practice.
Figure 5:
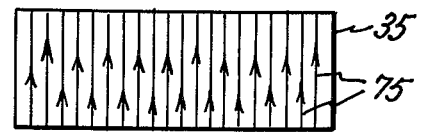
FIG. 5 is a view like that of FIG. 3 of a product of the present invention.
Figure 1A:
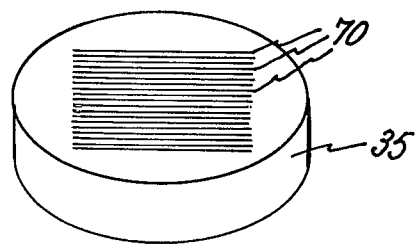

The product resulting from this experiment is illustrated in FIG. 1A, the deep diodes being indicated at 75 and the pattern of FIG. 1 being duplicated as to form and dimensions of lines and spacings on the upper surface of the workpiece. Again, this result contrasted with that representative of the prior art product illustrated in FIG. 3 in which the curving deep diode courses are indicated at 76.

EXAMPLE II

In an experiment designed to illustrate the excellent electrical characteristics of devices made by this invention, a varistor was produced using the procedure and apparatus described in Example I and the method disclosed and claimed in U.S. Pat. No. 3,901,736. Thus a body of N-type silicon one centimeter thick and of one inch diameter having 10 ohm-centimeter resistivity and a carrier concentration of $5 \times 10^{14}$ atoms per cubic centimeter was subjected to the thermal gradient zone melting process of migrating aluminum droplets, that is, "wires", through the silicon body. The method disclosed and claimed in our U.S. Pat. No. 3,898,106 was employed to accelerate the droplet migration with the result that the droplets traveled all the way through the wafer in 12 hours, the thermal gradient being maintained at 50° C. and the hot side temperature of the wafer being fixed at 1200° C. throughout the migration period. Each of the wire droplet trails was P-type conductivity recrystallized semiconductor material of the body and had a carrier concentration of $2 \times 10^{19}$ atoms per cubic centimeter and a resistivity of $8 \times 10^{-3}$ ohm-centimeter. The recrystallized regions were each 13 mils (325 microns) in thickness. A varistor measuring 0.6 centimeter in length, one centimeter in width and 0.2 centimeter in thickness was prepared from the above-processed body. The varistor had ten P-N junctions and its breakdown voltage was 4500 volts. The varistor showed electrical characteristics qualifying it for use in electric circuits to protect electrical equipment from overvoltages. The resistivity throughout the N- and P-type regions was substantially constant throughout the overall region and the processed body exhibited substantially theoretical physical values for the material used. Upon sectioning and examination, the varistor was found to have sharply-defined P-N junctions, each with a concentration profile of about 18 microns width.

In the devices of this invention, the trails left by the migrating droplet are actually regions of recrystallized material extending part way or all the way through the semiconductor matrix body crystal. The conductivity and resistivity of the crystal and the recrystallized region in each instance will be different so that these trails or recrystallized regions will form with the matrix body crystal P-N junctions suitably of the step type if desired. Alternatively, they may serve instead as lead-throughs if P-N junction characteristic does not exist in the structure. Recrystallized regions thus may be suitably doped with the material comprising the migrating droplet, that is, in admixture with the droplet metal, so as to provide impurity concentration sufficient to obtain the desired conductivity. The metal retained in the recrystallized region in each instance is substantially the maximum allowed by the solid solubility in the semiconductive material. It is a semiconductor material with maximum solid solubility of the impurity therein. It is not semiconductor material which has liquid solubility of the material. Neither is it a semiconductor material which is or contains a eutectic material. Further, such recrystallized region has a constant uniform level of impurity concentration throughout the length of the region or trail and the thickness of the recrystallized region is substantially constant throughout its depth or length.

While in the foregoing examples it has been indicated that the aluminum source of migrating droplet material was deposited under a vacuum of $1 \times 10^{-5}$ torr, it is to be understood that other vacuum conditions may be employed, particularly higher vacuums, and that lesser vacuums down to $3 \times 10^{-5}$ torr may be used with satisfactory results. We have found, however, that particularly in the case of aluminum, difficulty may be encountered in initiating droplet migration due to interference of oxygen with wetting of silicon by the aluminum when pressures greater than $3 \times 10^{-5}$ torr are used in this operation. Similarly, aluminum deposited by sputtering will be by virtue of saturation be difficult to use in this process of ours so far as initiation of the droplet penetration action is concerned. It is our preference, accordingly, for an aluminum deposition procedure which prevents more than inconsequential amounts of oxygen from being trapped in the aluminum deposits.

As a general proposition in carrying out the process of this invention and particularly the stage of forming the recesses or pits in the surface of the matrix body crystal to receive deposits of solid droplet source material, the depth of the recesses should not be greater than about 25 to 30 microns. This is for the purpose of avoiding the undercutting of the masking layer which would be detrimental in that the width of the droplet to be migrated might be too great or, in the extreme case, that the contact between the droplet and the matrix body surface would be limited to the extent that initiation of migration would be difficult and uncertain. In the normal use of the present invention process, the etching operation providing these recesses will be carried on for approximately five minutes at a temperature of 25° C. to provide a recess depth of about 25 microns with a window opening size of from 10 to 500 microns according to the size of the opening defined by the mask.

What we claim as new and desire to secure by Letters Patent of the United States is:

1. A semiconductor device comprising
    a body of single crystal semiconductor material of thickness greater than 10 mils having first and second major opposed surfaces comprising respectively, the top and bottom surfaces thereof, and having a first type conductivity and a vertical axis perpendicular to the top and bottom surfaces;
    a plurality of regions of second and opposite type conductivity, and opposed end surfaces, disposed in the body and extending between and terminating in the top and bottom surfaces, each of the end surfaces with a respective top or bottom surface, the material of said plurality of regions consisting of recrystallized semiconductor material of the body formed in situ in the body by the migration of a melt of metal-rich semiconductor material through the entire body from bottom to top by thermal gradient zone melting at a predetermined elevated temperature along a thermal gradient aligned substantially parallel with the said vertical axis of the body and having the metal distributed substantially uniformly throughout each entire region, the level of concentration of the metal therein being determined by the solid solubility limit of that metal in that semiconductor material of the body at that predetermined elevated temperature of migration, the metal comprising a sufficient quantity of at least one dopant impurity material to impart the second type conductivity thereto, the said regions being a low resistance path for conducting electrical currents between the major opposed surfaces of the body;

said regions of second type conductivity having vertical axes aligned substantially parallel with the vertical axis of the single crystal body and perpendicular to the body top and bottom surfaces; and, a P-N junction formed by the contiguous surfaces of the materials of each said region and the body.

2. The device of claim 1 which is a semiconductor varistor comprising a body of N-type silicon about one centimeter thick having 10 ohm-centimeter resistivity and a carrier concentration of $5 \times 10^{14}$ atoms per cubic centimeter through which aluminum droplets were migrated to provide recrystallized regions of P-type conductivity of thickness about 13 mils and carrier concentration of $2 \times 10^{19}$ atoms per cubic centimeter and resistivity of $8 \times 10^{-3}$ ohm-centimeter.

3. A diode device as described in claim 1 in which the migration trails of recrystallized material are column-like and of substantially uniform cross-sectional size from one-half to twenty mils.

4. A diode device as described in claim 1 in which the recrystallized regions are about 10 mils in diameter and are spaced apart from each other on about 20-mil centers.

5. The diode device of claim 1 in which the droplet migration trail recrystallized regions are elongated and substantially planar and of substantially uniform width from one to twenty mils, and in which the P-N junction is a step junction.

6. The device of claim 5 in which the migration trail recrystallized regions are spaced apart from two to twenty mils.

* * * * *